United States Patent
Lee et al.

(10) Patent No.: US 9,899,443 B2
(45) Date of Patent: Feb. 20, 2018

(54) COMPLEMENTARY METAL-OXIDE-SEMICONDUCTOR (CMOS) IMAGE SENSOR (CIS) PACKAGE WITH AN IMAGE BUFFER

(71) Applicant: Taiwan Semiconductor Manufacturing Co., Ltd., Hsin-Chu (TW)

(72) Inventors: Hsiao-Wen Lee, Hsinchu (TW); Kazuaki Hashimoto, Zhubei (TW); Kuo-Chung Yee, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/216,815

(22) Filed: Jul. 22, 2016

(65) Prior Publication Data

US 2018/0026067 A1    Jan. 25, 2018

(51) Int. Cl.
*H01L 23/48*  (2006.01)
*H01L 27/146*  (2006.01)
*H01L 23/00*  (2006.01)

(52) U.S. Cl.
CPC ........ *H01L 27/14634* (2013.01); *H01L 24/02* (2013.01); *H01L 24/13* (2013.01); *H01L 24/14* (2013.01); *H01L 27/1469* (2013.01); *H01L 27/14636* (2013.01); *H01L 27/14643* (2013.01); *H01L 2224/02379* (2013.01); *H01L 2224/13024* (2013.01); *H01L 2224/14135* (2013.01); *H01L 2924/1433* (2013.01); *H01L 2924/1436* (2013.01)

(58) Field of Classification Search
None
See application file for complete search history.

(56) References Cited

U.S. PATENT DOCUMENTS

| | | | |
|---|---|---|---|
| 2013/0249106 A1 | 9/2013 | Lin et al. | |
| 2014/0252646 A1* | 9/2014 | Hung | H01L 23/481 257/774 |
| 2015/0279897 A1* | 10/2015 | Yang | H01L 27/14634 257/448 |
| 2016/0358898 A1* | 12/2016 | Zhou | H01L 25/0657 |

OTHER PUBLICATIONS

Garrou, Phil. "IFTLE 199 Omnivision Roadmaps 3D stacking for CMOS Image Sensors; IC Insights Details Trends Shaping the IC Industry." Solid State Technology. Jul. 7, 2014.

* cited by examiner

*Primary Examiner* — Long Pham
(74) *Attorney, Agent, or Firm* — Eschweiler & Potashnik, LLC (57) ABSTRACT

A complementary metal-oxide-semiconductor (CMOS) image sensor (CIS) package is provided. The image sensor package comprises a first integrated circuit (IC) die, a second IC die, and a fan-out structure. The first IC die comprises a pixel sensor array, and the second IC die is under and bonded to the first IC die. Further, the fan-out structure is under and bonded to the second IC die. The fan-out structure comprises a third IC die, a fan-out dielectric layer laterally adjacent to the third IC die, a through insulator via (TIV) extending through the fan-out dielectric layer, and one or more redistribution layers (RDLs) under the third IC die and the TIV. The one or more RDLs electrically couple to the third IC die and the TIV. A method for manufacturing the CIS package is also provided.

20 Claims, 10 Drawing Sheets

COMPLEMENTARY METAL-OXIDE-SEMICONDUCTOR (CMOS) IMAGE SENSOR (CIS) PACKAGE WITH AN IMAGE BUFFER

BACKGROUND

Many modern day electronic devices comprise image sensors. Some types of image sensors include charge-coupled device (CCD) image sensors and complementary metal-oxide-semiconductor (CMOS) image sensors. Compared to CCD image sensors, CMOS image sensors are increasingly favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide-semiconductor (CMOS) image sensor (CIS) modules are packaged with dynamic random-access memory (DRAM) dies. A CIS module may be, for example, a single die or may be, for example, multiple CIS dies stacked and electrically coupled together. The DRAM dies serve as high bandwidth buffers for the CIS modules to allow for high speed and/or high resolution video and/or image capture. Such high speed and/or high resolution video and/or image capture includes, for example, 4K or 8K video capture at 60 or 120 frames per second (FPS). A challenge with packaging the CIS modules with the DRAM dies is that the CIS modules and the DRAM dies may have different sizes due to, for example, manufacture at different process nodes.

One approach for packaging the CIS modules with the DRAM dies uses chip-on-board (COB) substrates and wire bonding to address size mismatch. A CIS module is arranged on a top of a COB substrate and is electrically coupled to pads arranged on the top of the COB substrate, laterally adjacent to the CIS module, by wire bonds extending from the pads to a top of the CIS module. A DRAM die is arranged on a bottom of the COB substrate and is electrically coupled to the CIS module through the pads and an interconnect structure arranged within the COB substrate. Further, a ball grid array (BGA) is arranged on the bottom of the COB substrate, laterally adjacent to the DRAM die, and is electrically coupled to the CIS module and/or the DRAM die through the pads and the interconnect structure. However, bandwidth between the CIS module, the DRAM die, and the BGA is low and power consumption is high due to long conductive paths between the CIS module, the DRAM die, and the BGA. Further, the package is bulky due to use of the COB substrate.

Another approach for packaging the CIS modules with the DRAM dies uses custom designs for the DRAM dies so the sizes of the CIS modules match the DRAM dies. Stacking is then used to package the CIS modules with the DRAM dies so as to minimize package size. For example, a CIS module may be arranged over and bonded to a DRAM die, and may be electrically coupled to the DRAM die using through substrate vias (TSVs). However, custom designing the DRAM dies is costly and complicated.

The present application is directed towards a CIS package comprising a fan-out structure translating between different sizes of a CIS die and a DRAM die. In some embodiments, a first IC die comprises a pixel sensor array, a second IC die is under and bonded to the first IC die, and the fan-out structure is under and bonded to the second IC die. The fan-out structure comprises a third IC die, a fan-out dielectric layer laterally adjacent to the third IC die, a through insulator via (TIV) extending through the fan-out dielectric layer, and one or more redistribution layers (RDLs) under the third IC die and the TIV. The one or more RDLs electrically couple the third IC die to the TIV, so as to define a conductive path between the third IC die and the second IC die. The second IC die is the CIS die and the third IC die is the DRAM die in some embodiments, whereas the second IC die is the DRAM die and the third IC die is the CIS die in other embodiments. Further, where the second IC die is the CIS die, the first and second IC dies collectively define a CIS module.

The conductive path between the DRAM die and the CIS die is advantageously short and without wire bonding, such that bandwidth is high and power consumption is low. The high bandwidth allows video and/or image capture without shutter lag and/or frame delay, and/or allows long video and/or image capture time while data is processed in the background by an ISP. Further, the high bandwidth allows advanced ISP functions, such as, for example, four-dimensional (4D) focusing, motion detection, high-dynamic-range (HDR) imaging, high speed video capture, and high resolution video capture. Stacking the CIS die and the DRAM die advantageously allows for a small package size, and the fan-out structure advantageously allows for size mismatch between the CIS die and the DRAM die.

Figure 1A:
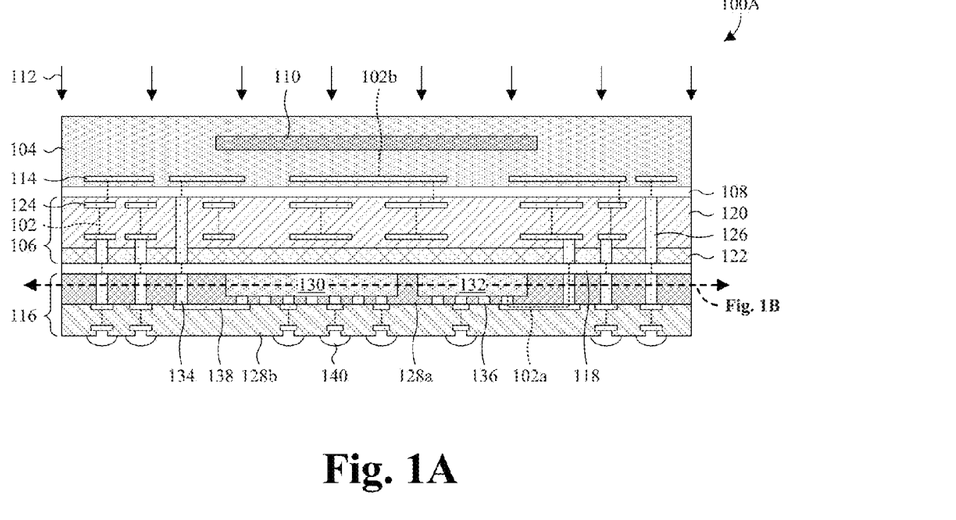
FIG. 1A illustrates a cross-sectional view of some embodiments of a complementary metal-oxide-semiconductor (CMOS) image sensor (CIS) package.

With reference to FIG. 1A, a cross-sectional view 100A of some embodiments of a CIS package is provided. For ease of illustration, dashed lines 102 are employed to represent non-limiting examples of conductive paths or wires. Other quantities and/or arrangements of the dashed lines 102 and/or of the conductive paths or wires are amenable.

As illustrated, a first IC die 104 is arranged over a second IC die 106, and is bonded and electrically coupled to the second IC die 106 by a first interface layer 108 arranged between the first and second IC dies 104, 106. The first IC die 104 comprises a pixel sensor array 110 configured to measure radiation 112 received from over the first IC die 104. The pixel sensor array 110 is electrically coupled to the first interface layer 108 and the second IC die 106 by first interconnect layers 114 arranged between the pixel sensor array 110 and the first interface layer 108. For ease of illustration, only one of the first interconnect layers 114 is shown. Further, in some embodiments, the first IC die 104 has sidewalls aligned to those of the second IC die 106 and/or has the same footprint as the second IC die 106. As used herein, a footprint is a two dimensional (2D) projection of an object onto an underlying horizontal plane.

The second IC die 106 is arranged over a fan-out structure 116, and is bonded and electrically coupled to the fan-out structure 116 by a second interface layer 118 arranged between the second IC die 106 and the fan-out structure 116. In some embodiments, the second IC die 106 is configured to perform data storage of measurements by the pixel sensor array 110 or ISP on the measurements. The second IC die 106 comprises an interlayer dielectric (ILD) layer 120 overlying a semiconductor substrate 122. The ILD layer 120 accommodates second interconnect layers 124 that are stacked within the ILD layer 120 and that, in some embodiments, are electrically coupled to the first interface layer 108. For ease of illustration, only some of the second interconnect layers 124 are illustrated. Further, the second IC die 106 comprises TSVs 126 extending through the semiconductor substrate 122 from a bottom of the second IC die 106. In some embodiments, at least one of the TSVs 126 extends from the second interface layer 118 to the second interconnect layers 124 to electrically couple the second interface layer 118 to the second interconnect layers 124. Further, in some embodiments, at least one of the TSVs 126 extends from the second interface layer 118 to the first interface layer 108 to electrically couple the second interface layer 118 to the first interface layer 108.

The fan-out structure 116 comprises a first fan-out dielectric layer 128a and a second fan-out dielectric layer 128b underlying the first fan-out dielectric layer 128a. Further, in some embodiments, the fan-out structure 116 has sidewalls aligned to those of the second IC die 106 and/or has the same footprint as the second IC die 106. The first fan-out dielectric layer 128a accommodates a third IC die 130, a fourth IC die 132, and through insulator vias (TIVs) 134. The third and fourth IC dies 130, 132 are both arranged along the second interface layer 118, and comprise pads 136 that are arranged along bottoms of the third and fourth IC dies 130, 132. The third IC die 130 may be, for example, configured to perform data storage of measurements by the pixel sensor array 110 or ISP on the measurements, and/or the fourth IC die 132 may be, for example, configured to provide wireless connectivity to the CIS package. The TIVs 134 neighbor the third and fourth IC dies 130, 132 and extend through the first fan-out dielectric layer 128a to the second interface layer 118. Further, the TIVs 134 electrically couple with the TSVs 126 through the second interface layer 118. In some embodiments, there is a one-to-one correspondence between the TIVs 134 and the TSVs 126. Further, in some embodiments, the TIVs 134 are aligned to the corresponding ones of the TSVs 126, and/or a layout or pattern of the TIVs 134 is the same as that of the TSVs 126. The second fan-out dielectric layer 128b accommodates one or more fan-out redistribution layers (RDLs) 138. For ease of illustration, only some of the fan-out RDLs 138 are illustrated.

The one or more fan-out RDLs 138 are electrically coupled to the pads 136 and the TIVs 134, such that the one or more fan-out RDLs 138 may, for example, electrically couple at least one of the pads 136 to at least one of the TIVs 134. The electrical coupling may, in turn, define one or more conductive paths (represented by a dashed line 102a) from the third and/or fourth IC dies 130, 132 to the second IC die 106. Further, in some embodiments, the one or more fan-out RDLs 138 are electrically coupled to a BGA 140 arranged under the fan-out structure 116. As such, the one or more fan-out RDLs 138 may, for example, electrically couple at least one of the pads 136 to the BGA 140 and/or may, for example, electrically couple the BGA 140 to the second IC die 106 through at least one of the TIVs 134.

The one or more conductive paths between the second IC die 106 and the third and fourth IC dies 130, 132 are advantageously short and without wire bonding, such that inter-die bandwidth is high and power consumption is low. The high bandwidth allows video and/or image capture without shutter lag and/or frame delay, and/or allows long video and/or image capture time while simultaneously processing data locally. Even more, the high bandwidth allows advanced local processing, such as, for example, 4D focusing, motion detection, HDR imaging, high speed video capture, and high resolution video capture. Stacking and electrically coupling the first, second, third, and fourth IC dies 104, 106, 130, 132 using the TIVs 134 and TSVs 126 advantageously allows for a small package size, and the fan-out structure 116 advantageously allows size mismatch between the second IC die 106 and the third and fourth IC dies 130, 132. Such mismatch may, for example, be due to manufacture of the second, third, and fourth IC dies 106, 130, 132 at different process nodes. By allowing size mismatch, standardized IC dies may, in turn, be used for the third and fourth IC dies 130, 132.

In some embodiments, the first IC die 104 is configured to measure radiation 112 incident thereon, the second IC die 106 is configured to perform ISP on the measurements, the third IC die 130 is configured to store the measurements, and the fourth IC die 132 is configured as a system on a chip (SoC). In such embodiments, the first and second IC dies 104, 106 may be, for example, CIS dies and/or the third IC die 130 may be, for example, a DRAM die. Further, in such embodiments, the first and second IC dies 104, 106 may define, for example, a CIS module. In other embodiments, the first IC die 104 is configured to measure radiation 112 incident thereon, the second IC die 106 is configured to store the measurements, the third IC die 130 is configured to perform ISP on the measurements, and the fourth IC die 132 is configured as the SoC. In such embodiments, the first and third IC dies 104, 130 may be, for example, CIS dies and/or the second IC die 106 may be, for example, a DRAM die. The SoC may, for example, provide the CIS package with wireless connectivity, such as WiFi, global positioning system (GPS), Bluetooth, or a combination of the foregoing.

While FIG. 1A includes the dashed lines 102 to represent conductive paths or wires, the number of dashed lines and/or the arrangement of the dashed lines 102 are not to be construed as limiting. Rather, as described above, the dashed lines 102 represent non-limiting examples of conductive paths or wires. Therefore, a dashed line 102b may, for example, be omitted, such that the pixel sensor array 110 may, for example, be electrically coupled to surrounding structure by conductive paths or wires that are not shown.

Figure 1B:
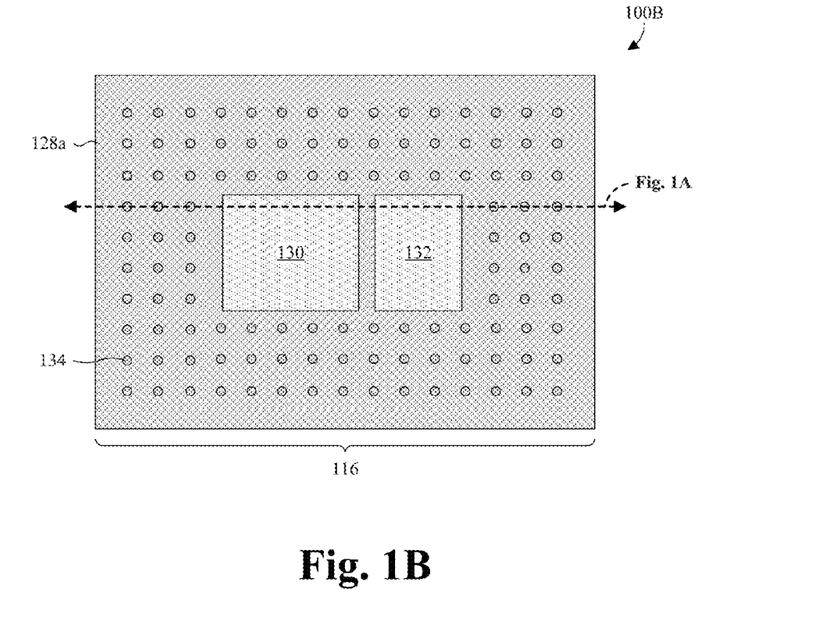
FIG. 1B illustrates a top view of some embodiments of the CIS package of FIG. 1A.

With reference to FIG. 1B, a top view 100B of some embodiments of the CIS package of FIG. 1A is provided. As illustrated, the TIVs 134 are laterally spaced along a periphery of the third and fourth IC dies 130, 132 to laterally enclose the third and fourth IC dies 130, 132. Further, the third and fourth IC dies 130, 132 have respective footprints that are smaller than a footprint of the first and second fan-out dielectric layers 128a, 128b and/or the fan-out structure 116. In some embodiments, the footprint of the fan-out structure 116 is the same as the of the of the first and second IC dies 104, 106.

While the embodiments of FIGS. 1A and 1B included the fourth IC die 132, the fourth IC die 132 may be omitted in other embodiments. Similarly, while the embodiments of FIGS. 1A and 1B included the first IC die 104, the first IC die 104 may be omitted in other embodiments, such that the pixel sensor array 110 is arranged within the second IC die 106. In such embodiments, the second IC die 106 may be, for example, a CIS die or module, and/or the third IC die 130 may be, for example, a DRAM die. Further, while the embodiments of FIGS. 1A and 1B included the BGA 140, other conductive structures, such as microbumps, may be used in place of the BGA 140 in other embodiments.

Figure 2A:
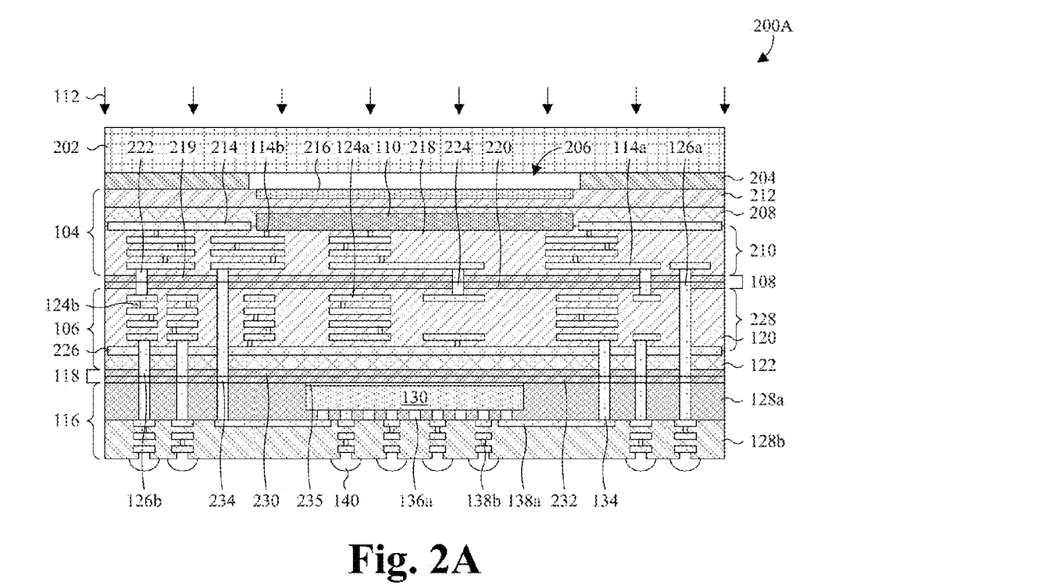
FIGS. 2A and 2B illustrate cross-sectional views of some more detailed embodiments of the CIS package of FIGS. 1A and 1B.

With reference to FIG. 2A, a cross-sectional view 200A of some more detailed embodiments of the CIS package of FIGS. 1A and 1B is illustrated. As illustrated, a first IC die 104 is arranged over and bonded to a second IC die 106 and, in some embodiments, is covered by a optical window 202 spaced over the first IC die 104 by a spacer layer 204 arranged along a periphery of the first IC die 104. In some embodiments, the spacer layer 204 extends laterally to enclose an optical medium 206 between the first IC die 104 and the optical window 202. The optical medium 206 may be, for example, air or some other gas. Further, in some embodiments, the spacer layer 204 and/or the optical window 202 have sidewalls aligned to those of the first IC die 104, and/or the optical window 202 has the same footprint as the first IC die 104. The first IC die 104 comprises a first semiconductor substrate 208 arranged over a first interconnect structure 210 and further covered by a passivation layer 212.

The first semiconductor substrate 208 accommodates a first device layer arranged between the first semiconductor substrate 208 and the first interconnect structure 210. The first semiconductor substrate 208 may be, for example, a bulk semiconductor substrate, such as bulk mono-crystalline silicon substrate, or a silicon-on-insulator (SOI) substrate. The first device layer includes a pixel sensor array 110 and a readout device layer 214. The pixel sensor array 110 is configured to measure radiation 112 received from over the first IC die 104 and comprises pixel sensors. The pixel sensors may be, for example, active pixel sensors (APSs) and/or may comprise photodiodes arranged in the first semiconductor substrate 208. The readout device layer 214 is arranged along a periphery of the pixel sensor array 110 and, in some embodiments, extends laterally to enclose the pixel sensor array 110. The readout device layer 214 is configured to readout the measurements and comprises, for example, transistors, memory cells, other electronic devices, or a combination of the foregoing.

The passivation layer 212 accommodates an array 216 of microlenses and/or of color filters arranged over the pixel sensor array 110, laterally between the readout device layer 214. The passivation layer 212 may be or otherwise include, for example, silicon dioxide, silicon nitride, some other dielectric, a molding compound, a polymer, a resin, or a multi-layer film comprising a combination of the foregoing. The microlenses are configured to focus the radiation 112 on corresponding ones of the pixel sensors, and/or the color filters are configured to selectively pass assigned colors or wavelengths of the radiation 112 to corresponding ones of the pixel sensors. In some embodiments, there is a one-to-one correspondence between the pixel sensors and the microlenses, and/or the microlenses overlap with the corresponding ones of the pixel sensors. Further, in some embodiments, there is a one-to-one correspondence between the pixel sensors and the color filters, and/or the color filters overlap with the corresponding ones of the pixel sensors.

The first interconnect structure 210 electrically couples the pixel sensor array 110 and the readout device layer 214 to the second IC die 106 through a first interface layer 108. The first interconnect structure 210 comprises a first ILD layer 218 accommodating first interconnect layers 114a, 114b stacked within the first ILD layer 218. The first ILD layer 218 may be or otherwise include, for example, silicon dioxide, silicon nitride, a low κ dielectric, some other dielectric, a molding compound, a polymer, a resin, or a multi-layer film comprising a combination of the foregoing. As used herein, a low-κ dielectric is a dielectric with a dielectric constant κ less than about 3.9. The first interconnect layers 114a, 114b comprise first interconnect layers 114a of lines and first interconnect layers 114b of vias alternatingly stacked within the first ILD layer 218. The first interconnect layers 114a of lines electrically couple neighboring first interconnect layers of vias together. The first interconnect layers 114b of vias electrically couple neighboring first interconnect layers of lines together, and further electrically couple the pixel sensor array 110 and the readout device layer 214 to the first interconnect layers 114a of lines. The first interconnect layers 114a, 114b may be, for example, copper, aluminum copper, aluminum, tungsten, some other conductive material, or a combination of the foregoing.

The first interface layer 108 is arranged between the first IC die 104 and the second IC die 106, and both bonds and electrically couples the first IC die 104 to the second IC die 106. In some embodiments, the first interface layer 108 is a layer of microbumps. In other embodiments, the first interface layer 108 is a first hybrid bond layer having both an insulator-to-insulator bond and a metal-to-metal bond. The first hybrid bond layer comprises a first inter-die dielectric (IDD) layer 219 and a second IDD layer 220 respectively arranged on the first IC die 104 and the second IC die 106. The first and second IDD layers 219, 220 may be or otherwise include, for example, silicon dioxide, silicon nitride, some other dielectric, a molding compound, a polymer, a resin, or multi-layer films comprising combinations of the foregoing. Further, the first hybrid bond layer comprises a first inter-die RDL 222, first TSVs 126*a*, and a second inter-die RDL 224. The first inter-die RDL 222 extends through the first IDD layer 219, from flush with the first IDD layer 219, and is electrically coupled to the first IC die 104. The first TSVs 126*a* and the second inter-die RDL 224 extend through the second IDD layer 220, from flush with the second IDD layer 220, and are electrically coupled to the second IC die 106 through the second IDD layer 220. Further, the first TSVs 126*a* extend through the second IC die 106 to a bottom of the second IC die 106. In some embodiments, the second inter-die RDL 224 and the first TSVs 126*a* define the same layout or pattern as the first inter-die RDL 222. The first and second inter-die RDLs 222, 224 and the first TSVs 126*a* may be, for example, copper, aluminum copper, tungsten, some other conductive material, or a combination of the foregoing.

The second IC die 106 is arranged over and bonded to a fan-out structure 116 by a second interface layer 118, and may be, for example, configured to perform ISP on measurements by the pixel sensor array 110, to store the measurements, or to perform some other function. Further, in some embodiments, the second IC die 106 has sidewalls aligned to those of the first IC die 104, and/or has the same footprint as the first IC die 104. The second IC die 106 comprises a second semiconductor substrate 122 supporting a second device layer 226 thereon, and further comprises a second interconnect structure 228 covering the second semiconductor substrate 122 and the second device layer 226. The second semiconductor substrate 122 may be, for example, a bulk semiconductor substrate, such as a bulk mono-crystalline silicon substrate, or an SOI substrate. The second device layer 226 may comprise, for example transistors, memory cells, such as DRAM memory cells, other electronic devices, or a combination of the foregoing.

The second interconnect structure 228 electrically couples the second device layer 226 to the first interface layer 108, the first TSVs 126*a*, the second TSVs 126*b*, or a combination of the foregoing. The second TSVs 126*b* extend through the second semiconductor substrate 122 to the second interconnect structure 228, and may be, for example, copper, aluminum copper, tungsten, some other conductive material, or a combination of the foregoing. The second interconnect structure 228 comprises a second ILD layer 120 accommodating second interconnect layers 124*a*, 124*b* stacked within the second ILD layer 120. The second ILD layer 120 may be, for example, silicon dioxide, silicon nitride, a low κ dielectric, some other dielectric, a molding compound, a polymer, a resin, or a multi-layer film comprising a combination of the foregoing. The second interconnect layers 124*a*, 124*b* comprise second interconnect layers 124*a* of lines and second interconnect layers 124*b* of vias alternatingly stacked within the second ILD layer 120. The second interconnect layers 124*a* of lines electrically couple neighboring second interconnect layers of vias together. The second interconnect layers 124*b* of vias electrically couple neighboring second interconnect layers of lines together, and further electrically couple the second device layer 226 to the second interconnect layers 124*a* of lines. The second interconnect layers 124*a*, 124*b* may be, for example, copper, aluminum copper, tungsten, some other conductive material, or a multi-layer film comprising a combination of the foregoing.

The second interface layer 118 is arranged between the second IC die 106 and the fan-out structure 116, and both bonds and electrically couples the second IC die 106 to the fan-out structure 116. In some embodiments, the second interface layer 118 is a layer of microbumps. In other embodiments, the second interface layer 118 is a second hybrid bond layer having both an insulator-to-insulator bond and a metal-to-metal bond. The second hybrid bond layer comprises a third IDD layer 230 and a fourth IDD layer 232 respectively arranged on the second IC die 106 and the fan-out structure 116. The third and fourth IDD layers 230, 232 may be, for example, silicon dioxide, silicon nitride, some other dielectric, a molding compound, a polymer, a resin, or multi-layer films comprising combinations of the foregoing. Further, the second hybrid bond layer comprises the first and second TSVs 126*a*, 126*b* and a cap layer 234. The first and second TSVs 126*a*, 126*b* extend through the third IDD layer 230 from flush with the third IDD layer 230. The cap layer 234 extends through the fourth IDD layer 232, from flush with the fourth IDD layer 232, and is electrically coupled to the fan-out structure 116. Further, in some embodiments, the cap layer 234 has the same layout or pattern as the first and second TSVs 126*a*, 126*b*. The cap layer 234 may be, for example, copper, aluminum copper, aluminum, tungsten, some other conductive material, or a combination of the foregoing.

The fan-out structure 116 comprises a first fan-out dielectric layer 128*a* and a second fan-out dielectric layer 128*b* arranged under the first fan-out dielectric layer 128*a*. The first and second fan-out dielectric layers 128*a*, 128*b* may be or otherwise include, for example, silicon dioxide, silicon nitride, some other dielectric, a molding compound, a polymer, a resin, or multi-layer films comprising combinations of the foregoing. The first fan-out dielectric layer 128*a* accommodates a third IC die 130 and TIVs 134, and the second fan-out dielectric layer 128*b* accommodates one or more fan-out RDLs 138*a*, 138*b*. The fan-out structure 116 is configured to translate between different sizes of the third IC die 130 and the second IC die 106. In some embodiments, the fan-out structure 116 has sidewalls aligned to those of the second IC die 106, and/or has the same footprint as the second IC die 106.

The third IC die 130 is arranged along the second interface layer 118 and may be, for example, configured to perform ISP on measurements by the pixel sensor array 110, to store the measurements, or to perform some other function. Further, in some embodiments, the third IC die 130 is bonded to the second interface layer 118 through an adhesive layer 235, such as, for example, a layer of epoxy or glue. The third IC die 130 comprises pads 136*a* that are arranged along a bottom of the third IC die 130. Further, the third IC die 130 comprises a third interconnect structure (not shown) arranged under a third semiconductor substrate (not shown), between the third semiconductor substrate and the pads 136*a*. The pads 136*a* are electrically coupled to the one or more fan-out RDLs 138*a*, 138*b* and, in some embodiments, are even with an interface between the first and second fan-out dielectric layers 128*a*, 128*b*. Even more, the third IC die 130 comprises a third device layer (not shown) arranged between the third semiconductor substrate and the third interconnect structure.

The TIVs 134 neighbor the third IC die 130 and extend through the first fan-out dielectric layer 128*a*, from the one or more fan-out RDLs 138*a*, 138*b* to the second interface layer 118. Further, the TIVs 134 are electrically couple to the first and second TSVs 126*a*, 126*b* through the second interface layer 118. In some embodiments, there is a one-to-one correspondence between the TIVs 134 and the first and second TSVs 126*a*, 126*b*, and/or the TIVs 134 are aligned to the corresponding ones of the first and second TSVs 126*a*, 126*b*. Further, in some embodiments, the TIVs 134 define the same layout or pattern as the first and second TSVs 126*a*, 126*b*. The TIVs 134 may be, for example, copper, aluminum copper, aluminum, tungsten, some other conductive material, or a combination of the foregoing.

The one or more fan-out RDLs 138a, 138b are electrically coupled to the pads 136a and the TIVs 134. Further, in some embodiments, the one or more fan-out RDLs 138a, 138b are electrically coupled to a BGA 140 arranged under the fan-out structure 116. The one or more fan-out RDLs 138a, 138b may, for example, electrically couple the pads 136a to the TIVs 134 and/or the BGA 140, and/or may, for example, electrically couple the BGA 140 to the TIVs 134. In some embodiments, the one or more fan-out RDLs 138a, 138b comprise fan-out RDLs 138a of lines and fan-out RDLs 138b of vias alternatingly stacked within the second fan-out dielectric layer 128b. The fan-out RDLs 138a of lines electrically couple neighboring fan-out RDLs of vias together, and electrically couple with the TIVs 134 and, in some embodiments, the BGA 140. The fan-out RDLs 138b of vias electrically couple neighboring fan-out RDLs of lines. The fan-out RDLs 138a, 138b may be, for example, copper, aluminum copper, tungsten, some other conductive material, or a combination of the foregoing.

Figure 2B:
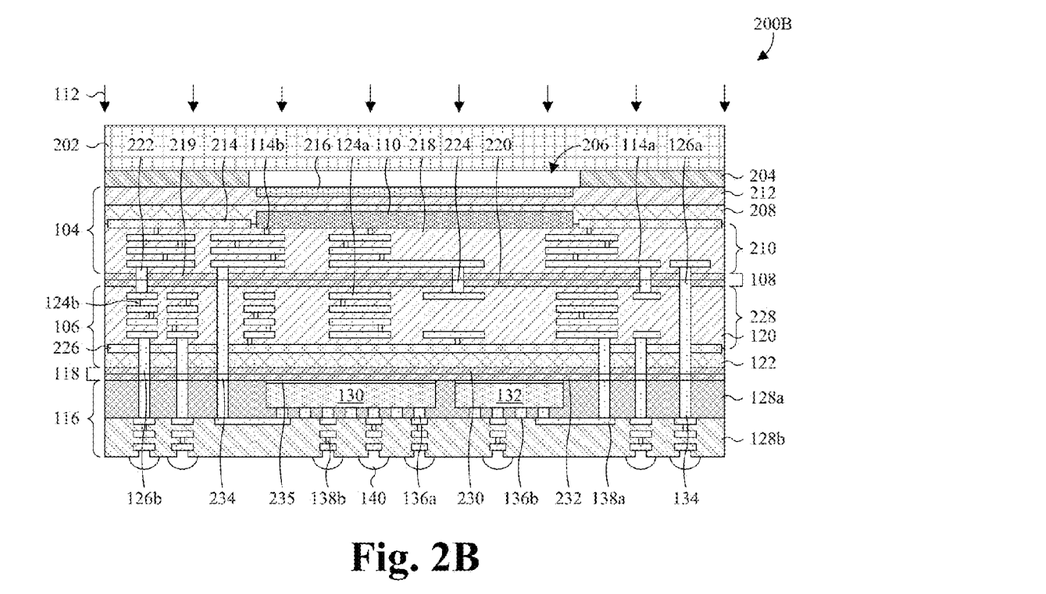

With reference to FIG. 2B, a cross-sectional view 200B of some other more detailed embodiments of the CIS package of FIG. 2A is provided. As illustrated, the first fan-out dielectric layer 128a further accommodates a fourth IC die 132 that may be, for example, configured as an SoC. The fourth IC die 132 is arranged along the second interface layer 118, laterally adjacent to the third IC die 130, and is electrically coupled to the TIVs 134 and/or the BGA 140 by the fan-out RDLs 138a, 138b. Further, in some embodiments, the fourth IC die 132 is bonded to the second interface layer 118 through the adhesive layer 235. The fourth IC die 132 comprises a fourth interconnect structure (not shown) arranged under a fourth semiconductor substrate (not shown), between the fourth semiconductor substrate and pads 136b of the fourth IC die 132. Further, the fourth IC die 132 comprises a fourth device layer (not shown) arranged between the fourth semiconductor substrate and the fourth interconnect structure. The fourth IC die 132 may be, for example, a SoC configured to provide the CIS package with wireless conductive, such as Bluetooth connectivity.

While the embodiments of FIGS. 2A and 2B included both the first TSVs 126a and the second TSVs 126b, the first TSVs 126a or the second TSVs 126b may be omitted in other embodiments. Similarly, while the embodiments of FIGS. 2A and 2B included both the first TSVs 126a and the second inter-die RDL 224, the first TSVs 126a or the second inter-die RDL 224 may be omitted in other embodiments. Further, while the embodiments of FIGS. 2A and 2B used the BGA 140 for external connectivity, other conductive structures may be used in place of the BGA 140 in other embodiments. Even more, while the embodiments of FIGS. 2A and 2B included the first IC die 104, the first IC die 104 may be omitted in other embodiments, such that the pixel sensor array 110 is arranged within the second IC die 106.

With reference to FIGS. 3-16, a series of cross-sectional views 300-1600 of some embodiments of a method for manufacturing a CIS package is provided. The CIS package may, for example, be configured as described in FIG. 2A.

Figure 3:
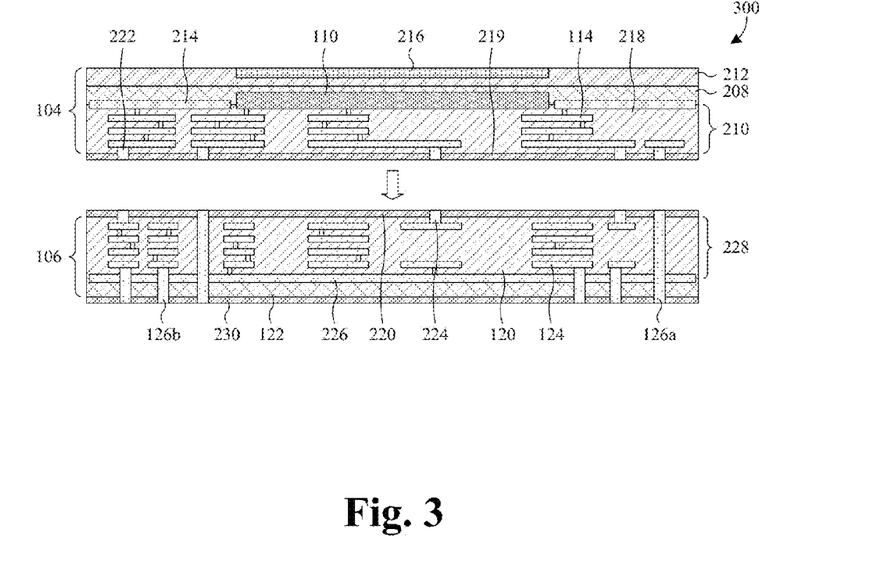
FIGS. 3-16 illustrate a series of cross-sectional views of some embodiments of a method for manufacturing a CIS package.

As illustrated by the cross-sectional view 300 of FIG. 3, a first IC die 104 and a second IC die 106 are provided or otherwise formed. The first and second IC dies 104, 106 may be formed using CMOS manufacturing processes. Further, the first and second IC dies 104, 106 may, for example, define a CIS module.

The first IC die 104 comprises a first semiconductor substrate 208 covered by a passivation layer 212 and arranged over a first interconnect structure 210. The first semiconductor substrate 208 accommodates a first device layer arranged between the first semiconductor substrate 208 and the first interconnect structure 210. The first device layer comprises a pixel sensor array 110 and a readout device layer 214. The passivation layer 212 accommodates an array 216 of microlenses and and/or of color filters arranged over the pixel sensor array 110. The first interconnect structure 210 comprises a first ILD layer 218 accommodating first interconnect layers 114 stacked within the first ILD layer 218. Further, the first interconnect structure 210 electrically couples the pixel sensor array 110 and the readout device layer 214 to a first inter-die RDL 222 arranged on a bottom of the first IC die 104. The first inter-die RDL 222 extends through a first IDD layer 219 that is also arranged on the bottom of the first IC die 104, from flush with the first IDD layer 219, to electrically couple with the first interconnect structure 210.

The second IC die 106 comprises a second semiconductor substrate 122 supporting a second device layer 226 thereon, and further comprises a second interconnect structure 228 covering the second semiconductor substrate 122 and the second device layer 226. The second interconnect structure 228 comprises a second ILD layer 120 accommodating second interconnect layers 124 stacked within the second ILD layer 120. In some embodiments, the second interconnect structure 228 electrically couples the second device layer 226 to a second inter-die RDL 224 arranged over the second interconnect structure 228 and/or to second TSVs 126b. Further, in some embodiments, the second interconnect structure 228 electrically couples the second TSVs 126b to the second inter-die RDL 224. The second inter-die RDL 224 extends through a second IDD layer 220 that covers the second interconnect structure 228, from flush with the second IDD layer 220, to electrically couple with the second interconnect structure 228. Further, the second inter-die RDL 224 and first TSVs 126a collectively define the same pattern or layout as the first inter-die RDL 222. The first and second TSVs 126a, 126b extend through the second semiconductor substrate 122 and through a third IDD layer 230 underlying the second semiconductor substrate 122, from flush with the third IDD layer 230. The first TSVs 126a also extend through the second IDD layer 220 to flush with the second IDD layer 220, and the second TSVs 126b extend to the second interconnect structure 228.

Also illustrated by the cross-sectional view 300 of FIG. 3, the first IC die 104 and the second IC die 106 are electrically coupled and bonded together through the first and second IDD layers 219, 220 using hybrid bonding. For example, the first and second IDD layers 219, 220 are directly bonded together and the first inter-die RDL 222 is directly bonded to the second inter-die RDL 224 and the second TSVs 126b. In some embodiments, the process for directly bonding the first and second IDD layers 219, 220 together comprises treatment of neighboring surfaces of the first and second IDD layers 219, 220, cleaning the neighboring surfaces, pressing the neighboring surfaces together, and annealing. The treatment may comprise, for example, annealing the neighboring surfaces in the presence of nitrogen and/or hydrogen gas. The cleaning may comprise, for example, rinsing the neighboring surfaces with deionized water.

Figure 4:
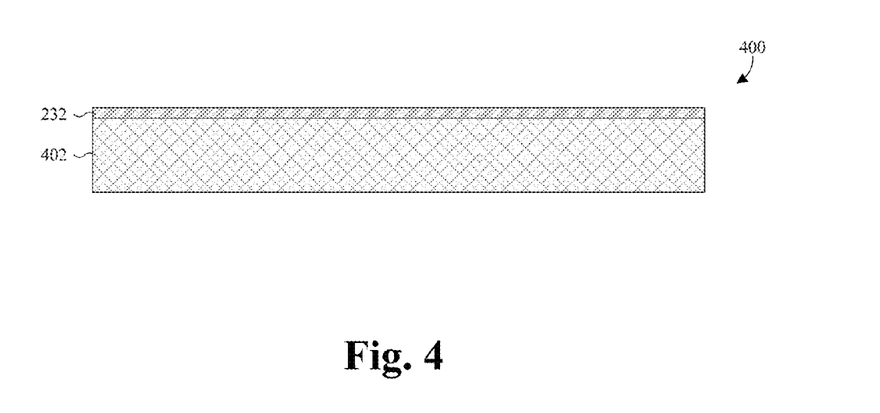

As illustrated by the cross-sectional view 400 of FIG. 4, a fourth IDD layer 232 is formed over a first carrier wafer 402. The first carrier wafer 402 may be, for example, glass, silicon oxide, aluminum oxide, or a combination thereof. In some embodiments, the fourth IDD layer 232 is formed of a dielectric, such as silicon dioxide, and/or is formed by vapor deposition, atomic layer deposition (ALD), spin coating, thermal oxidation, or some other growth or deposition process. Vapor deposition may comprise, for example, chemical vapor deposition (CVD) or physical vapor deposition (PVD).

Figure 5:
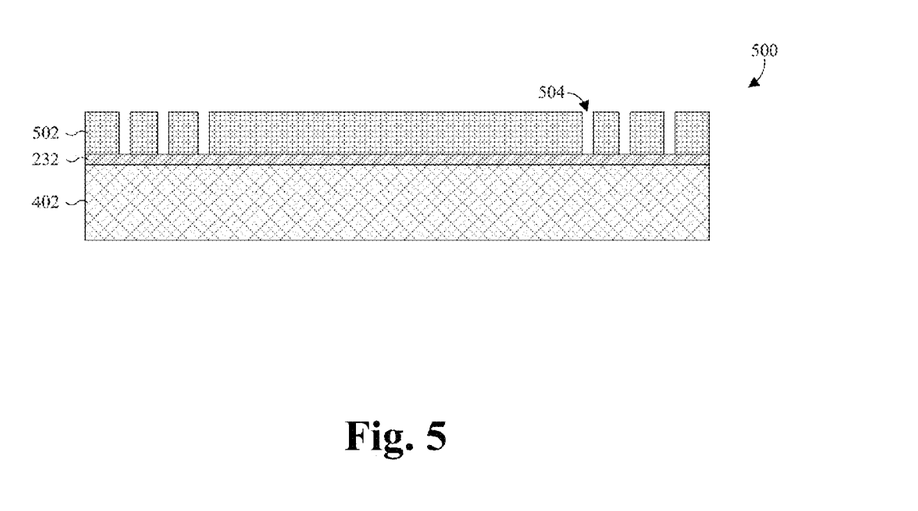

As illustrated by the cross sectional view 500 of FIG. 5, a first photoresist layer 502 is formed over the fourth IDD layer 232 with TIV openings 504. The TIV openings 504 are formed with the same pattern or layout as the first and second TSVs 126a, 126b (see FIG. 3) and may, for example, be formed outside a central region of the fourth IDD layer 232. In some embodiments, the process for forming the TIV openings 504 comprises depositing the first photoresist layer 502 and subsequently patterning the first photoresist layer 502 according to the pattern or layout of the first and second TSVs 126a, 126b. The first photoresist layer 502 may, for example, be deposited by spin coating and/or may, for example, be patterned using photolithography. In alternative embodiments, a hard mask or some other type of mask may be used in place of the first photoresist layer 502.

Figure 6:
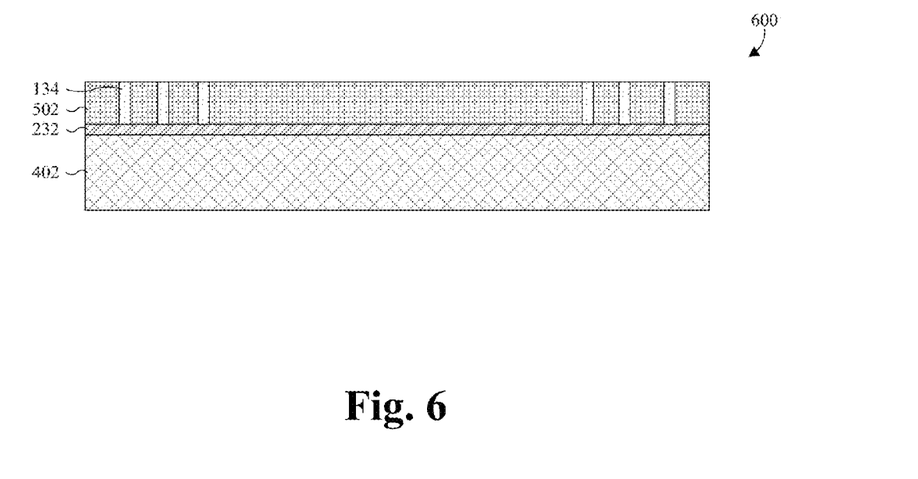

As illustrated by the cross-sectional view 600 of FIG. 6, TIVs 134 are formed in the TIV openings 504 (see FIG. 5) of the first photoresist layer 502. In some embodiments, the process for forming the TIVs 134 comprises depositing or otherwise growing a conductive layer filling the TIV openings 504, and subsequently performing a planarization into the conductive layer to coplanarize an upper or top surface of the conductive layer with that of the first photoresist layer 502. The conductive layer may be deposited or grown by, for example, vapor deposition, ALD, or electrochemical plating (ECP), and/or the planarization may be performed by, for example, chemical mechanical polishing (CMP). Further, in some embodiments, the process comprises stripping or otherwise removing the first photoresist layer 502. The first photoresist layer 502 may be stripped or otherwise removed by, for example, a sulfuric acid-hydrogen peroxide mixture (SPM).

Figure 7:
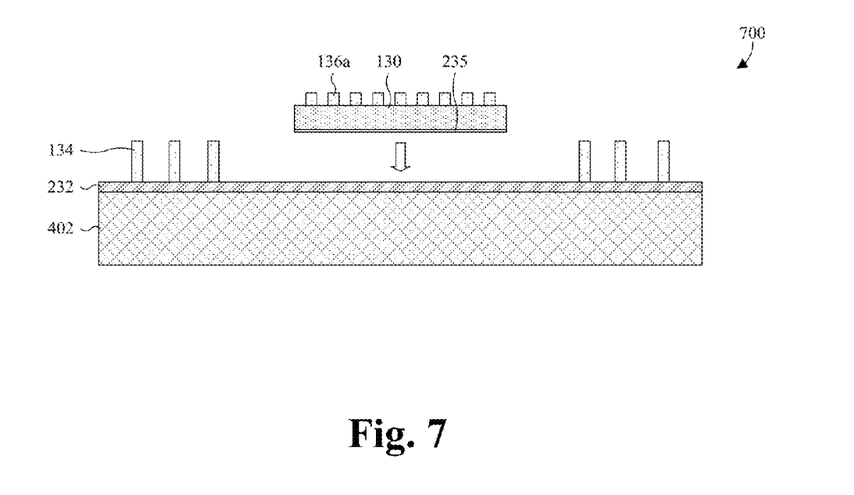

As illustrated by the cross-sectional view 700 of FIG. 7, a third IC die 130 is provided or otherwise formed, and subsequently bonded to the central region of the fourth IDD layer 232. The third IC die 130 comprises pads 136a arranged along a top of the third IC die 130 to electrically couple the third IC die 130 to external devices. In some embodiments, the third IC die 130 is formed using CMOS manufacturing processes, and/or the bonding is achieved by an adhesive layer 235 arranged between the fourth IDD layer 232 and the third IC die 130.

While not illustrated, it is to be appreciated that a fourth IC die may be provided or otherwise formed in other embodiments. The fourth IC die may then be bonded to the central region of fourth IDD layer 232, laterally adjacent to the third IC die 130.

Figure 8:
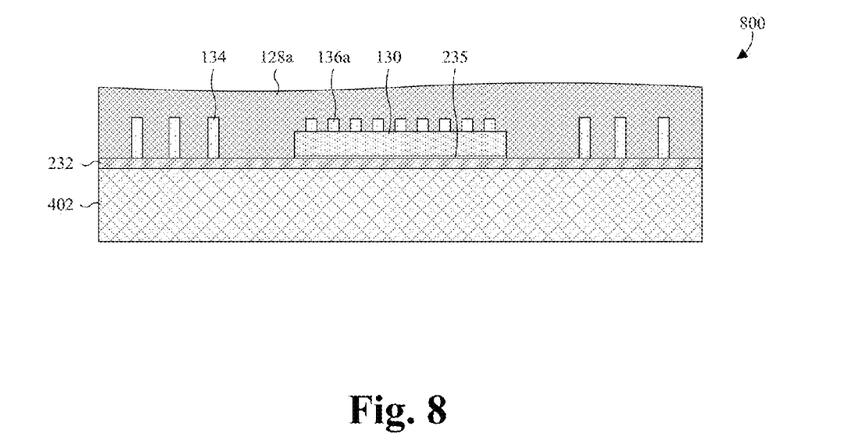

As illustrated by the cross-sectional view 800 of FIG. 8, a first fan-out dielectric layer 128a is formed covering the TIVs 134 and the third IC die 130, and laterally surrounding and between the TIVs 134 and the third IC die 130. In some embodiments, the process for forming the first fan-out dielectric layer 128a comprises depositing or otherwise growing the first fan-out dielectric layer 128a. The first fan-out dielectric 128a may be formed by, for example, vapor deposition, ALD, thermal oxidation, or some other deposition or growth process.

Figure 9:
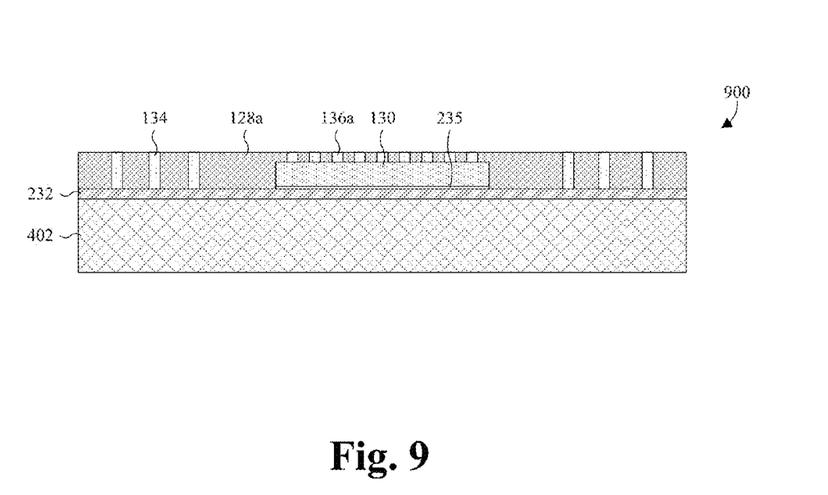

As illustrated by the cross-sectional view 900 of FIG. 9, a planarization is performed into an upper or top surface of the first fan-out dielectric layer 128a to coplanarize the upper or top surface of the first fan-out dielectric layer 128a with upper or top surfaces of the TIVs 134 and upper or top surfaces of the pads 136a. The planarization may be performed by, for example, a CMP and/or an etch back.

Figure 10:
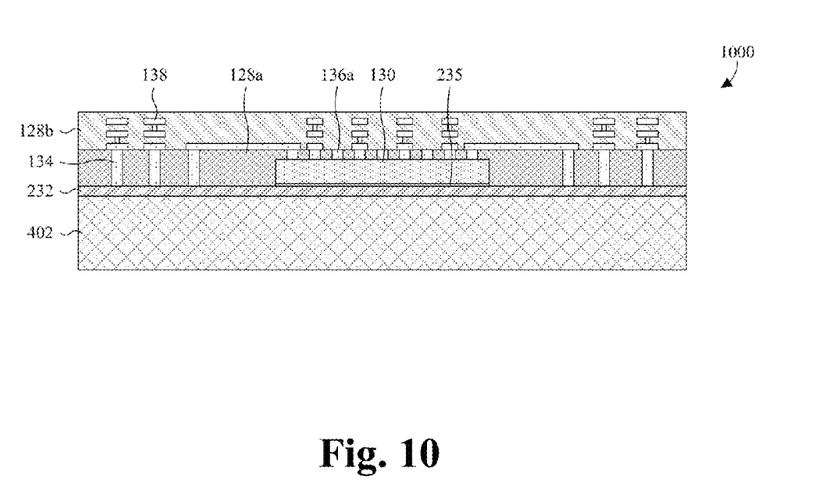

As illustrated by the cross-sectional view of FIG. 10, one or more fan-out RDLs 138 are formed over the first fan-out dielectric layer 128a and stacked with a second fan-out dielectric layer 128b. The one or more fan-out RDLs 138 electrically couple with the pads 136a and the TIVs 134, and further electrically couple at least one of the pads 136a to at least one of the TIVs 134. In some embodiments, the one or more fan-out RDLs 138 are formed according to a dual-damascene-like process or a single-damascene-like process. A dual-damascene-like process is a dual damascene process that is not limited to copper, and a single-damascene-like process is a single damascene process that is not limited to copper. Further, in some embodiments, the second fan-out dielectric layer 128b is a multi-layer film that is incrementally formed with the one or more fan-out RDLs 138.

Figure 11:
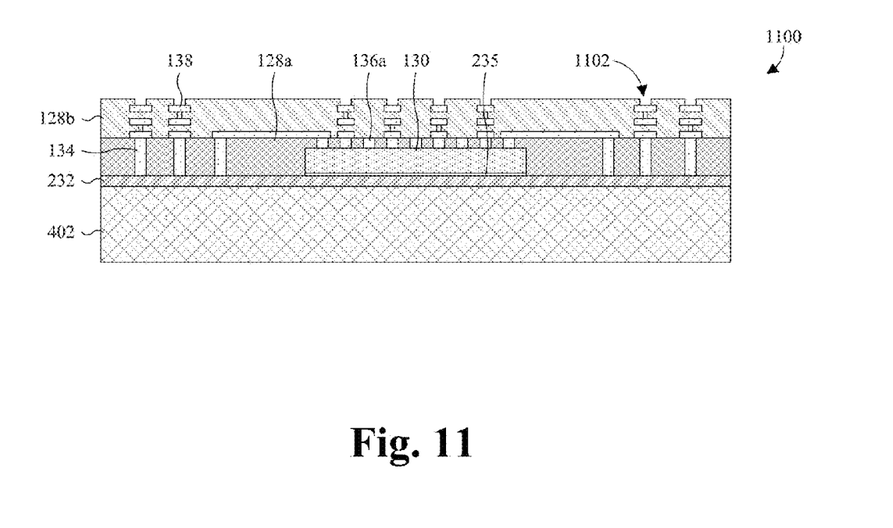

As illustrated by the cross-sectional view 1100 of FIG. 11, a first etch is performed into the second fan-out dielectric layer 128b to form BGA openings 1102 exposing features of the one or more fan-out RDLs 138. In some embodiments, the process for performing the first etch comprises depositing a second photoresist layer over the second fan-out dielectric layer 128b, and patterning the second photoresist layer with a pattern or layout of the BGA openings 1102. The second photoresist layer may, for example, be deposited by spin coating and/or may, for example, be patterned using photolithography. Further, in some embodiments, the process comprises applying one or more etchants to the second fan-out dielectric layer 128b with the second photoresist layer in place, and subsequently stripping the second photoresist layer. The etchants may be, for example, wet or dry etchants, and/or the second photoresist layer may, for example, be stripped by SPM.

Figure 12:
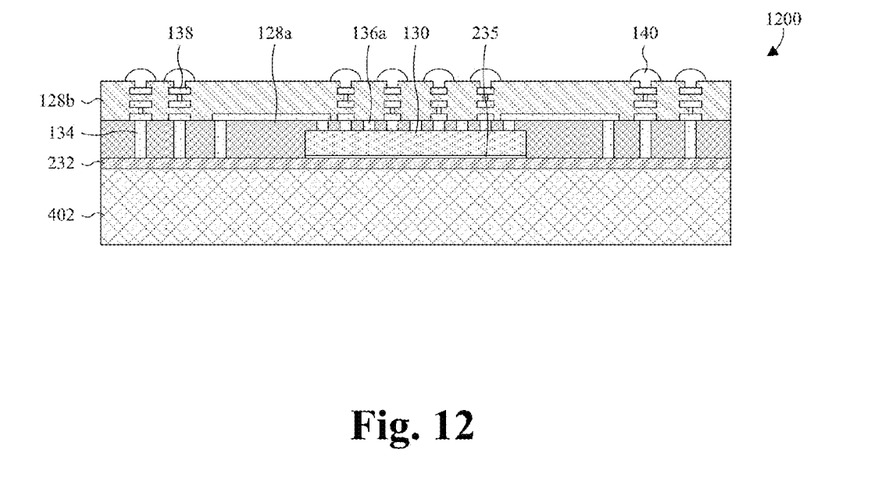

As illustrated by the cross-sectional view 1200 of FIG. 12, a BGA 140 is formed in the BGA openings 1102 (see FIG. 11). In some embodiments, the process for forming the BGA 140 comprises depositing solder in the BGA openings 1102, and subsequently performing a reflow operation to round the depositions. The reflow process may comprise, for example, heating the depositions until the depositions melt.

Figure 13:
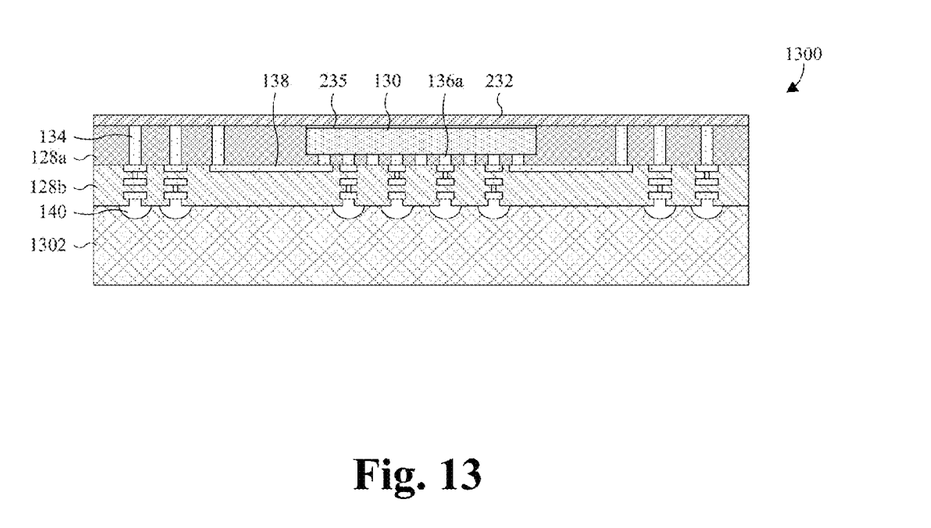

As illustrated by the cross-sectional view 1300 of FIG. 13, a second carrier wafer 1302 is bonded to the structure of FIG. 12 through the BGA 140, and the first carrier wafer 402 (see FIG. 12) is de-bonded and removed from the fourth IDD layer 232. The second carrier wafer 1302 may be, for example, glass, silicon oxide, aluminum oxide, or a combination thereof. In some embodiments, the second carrier wafer 1302 is bonded to the structure of FIG. 12 with the BGA 140 sunken into the second carrier wafer 1302. Further, in some embodiments, the process for bonding the structure of FIG. 12 to the second carrier wafer 1302 comprises pressing the structure into the second carrier wafer 1302 in the presence of heat and with sufficient force to sink the BGA 140 into the second carrier wafer 1302. In some embodiments, the process for de-bonding the first carrier wafer 402 comprises pulling the first carrier wafer 402 apart from the fourth IDD layer 232 with sufficient force to break the bond therebetween.

Figure 14:
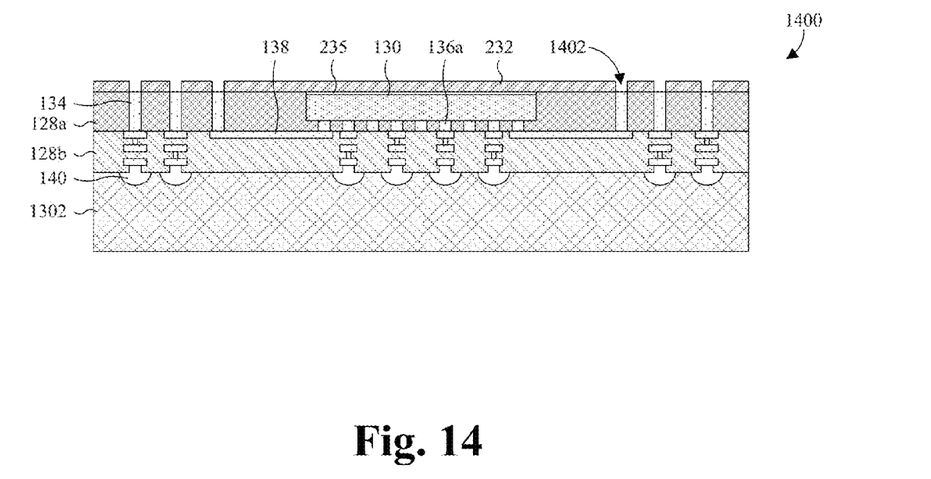

As illustrated by the cross-sectional view 1400 of FIG. 14, cap openings 1402 are formed in the fourth IDD layer 232 to expose the TIVs 134. In some embodiments, the process for forming the cap openings 1402 comprises a second etch into the fourth IDD layer 232. The second etch may be performed, for example, with a third photoresist layer in place that is patterned with a pattern of the cap openings 1402 using photolithography. In other embodiments, the process for forming the cap openings 1402 comprises drilling into the fourth IDD layer 232 to form the cap openings 1402.

Figure 15:
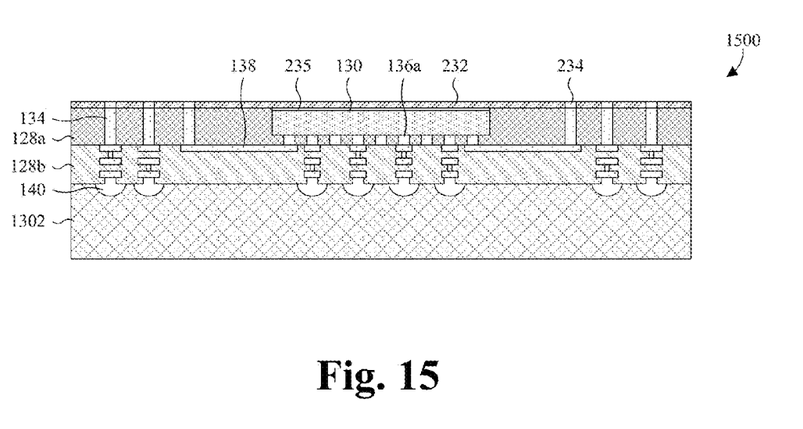

As illustrated by the cross-sectional view 1500 of FIG. 15, a cap layer 234 is formed filling the cap openings 1402 (see FIG. 14). In some embodiments, the process for forming the cap layer 234 comprises depositing or growing the cap layer 234, such that the cap layer 234 also covers the fourth IDD layer 232, and subsequently performing a planarization into the cap layer 234 to coplanarize an upper or top surface of the cap layer 234 with an upper or top surface of the fourth IDD layer 232. The cap layer 234 may be deposited or grown by, for example, vapor deposition, ALD, ECP, or some other deposition or grown processes. The planarization may be performed by, for example, a CMP. In other embodiments, the process for forming the cap layer 234 comprises individually depositing solder in the cap openings 1402.

Figure 16:
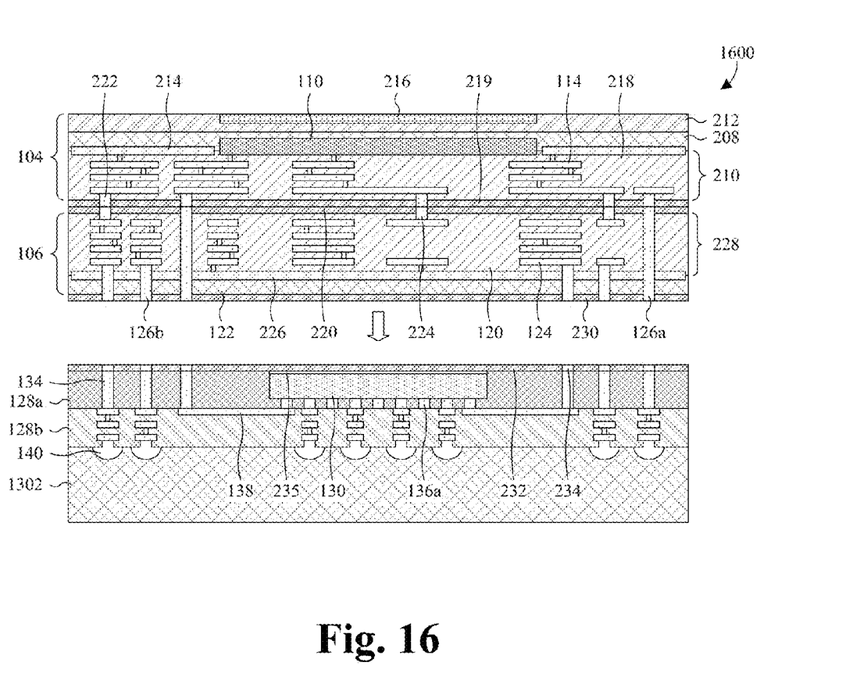

As illustrated by the cross-sectional view 1600 of FIG. 16, the structure of FIG. 15 and the structure of FIG. 3 are electrically coupled and bonded together by hybrid bonding. In some embodiments, the third and fourth IDD layers 230, 232 are directly bonded together and the cap layer 234 is directly bonded to the first and second TSVs 126a, 126b. Further, in some embodiments, the process for directly bonding the third and fourth IDD layers 230, 232 together comprises treatment of neighboring surfaces corresponding to the structure of FIG. 15 and the structure of FIG. 3, cleaning the neighboring surfaces, pressing the neighboring surfaces together, and annealing. The treatment may comprise, for example, annealing the neighboring surfaces in the presence of nitrogen and/or hydrogen gas. The cleaning may comprise, for example, rinsing the neighboring surfaces with deionized water.

While the method of FIGS. 3-16 was directed towards the embodiments of FIG. 2A, it is to be appreciated that the method may be applied to form other embodiments, such as the embodiments of FIG. 2B. Further, while not illustrated in FIGS. 3-16, the second carrier wafer 1302 may be de-bonded from the BGA 140 following the actions of FIG. 16. In some embodiments, the de-bonding is performed by pulling the BGA 140 and the second carrier wafer 1302 apart with sufficient force to break the bond. Even more, while hybrid bonding between the first and second IC dies 104, 106 and between the structures of FIGS. 3 and 15 was illustrated with FIGS. 3-16, it is to be appreciated that other approaches to bonding and electrically coupling may be employed. For example, microbumps map be employed to bond and electrically couple the structures of FIGS. 3 and 15 together. Moreover, while the BGA 140 was illustrated with FIGS. 3-16, the BGA 140 may be replaced by other conductive structures.

Figure 17:
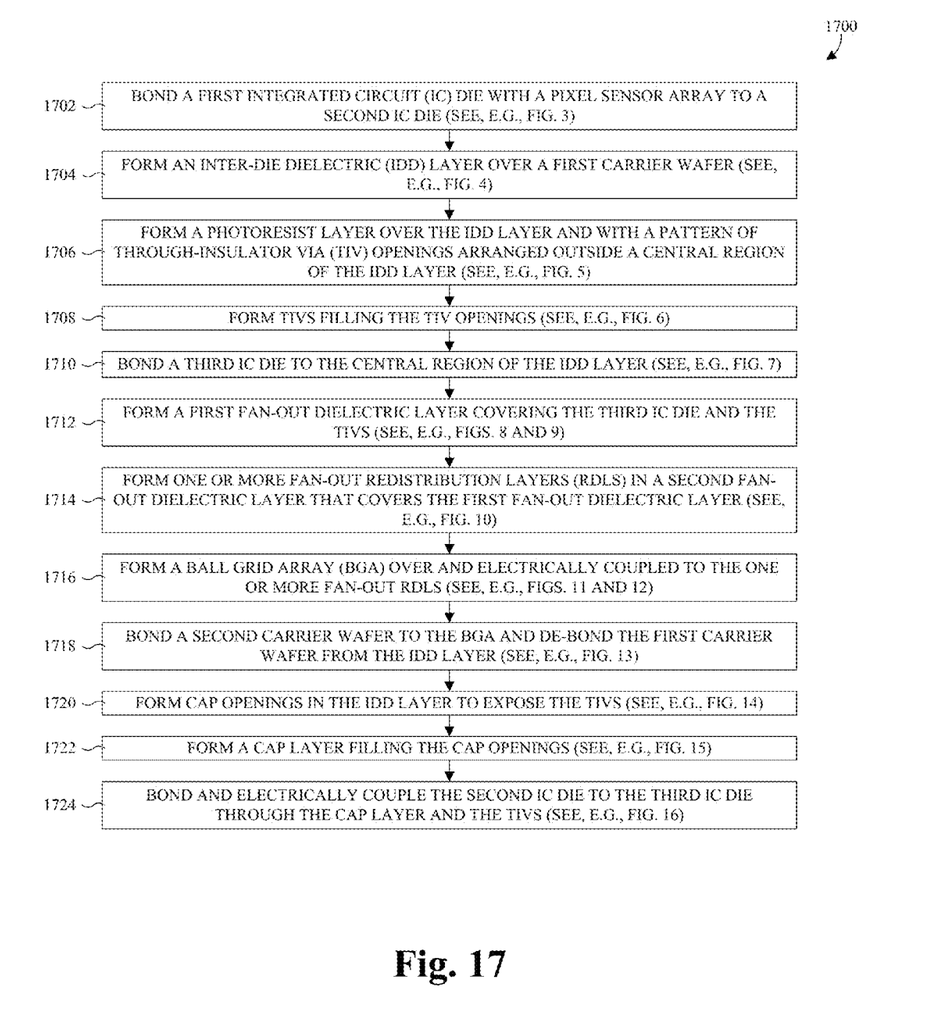
FIG. 17 illustrates a flowchart of some embodiments of the method of FIGS. 3-16.

With reference to FIG. 17, a flowchart 1700 of some embodiments of the method of FIGS. 3-16 is provided.

At 1702, a first IC die with a pixel sensor array is bonded to a second IC die. See, for example, FIG. 3.

At 1704, an IDD layer is formed over a first carrier wafer. See, for example, FIG. 4.

At 1706, a photoresist layer is formed over the IDD layer and with a pattern of TIV openings arranged outside a central region of the IDD layer. See, for example, FIG. 5.

At 1708, TIVs are formed filling the TIV openings. See, for example, FIG. 6.

At 1710, a third IC die is bonded to the central region of the IDD layer. See, for example, FIG. 7. In some embodiments, a fourth IC die is also bonded to the central region, laterally adjacent to the third IC die.

At 1712, a first fan-out dielectric layer is formed covering the third IC die and the TIVs. See, for example, FIGS. 8 and 9.

At 1714, one or more fan-out RDLs are formed in a second fan-out dielectric layer that covers the first fan-out dielectric layer. See, for example, FIG. 10.

At 1716, a BGA is formed over and electrically coupled to the one or more fan-out RDLs. See, for example, FIGS. 11 and 12.

At 1718, a second carrier wafer is bonded to the BGA and the first carrier wafer is de-bonded from the IDD layer. See, for example, FIG. 13.

At 1720, cap openings are formed in the IDD layer to expose the TIVs. See, for example, FIG. 14.

At 1722, a cap layer is formed filling the cap openings. See, for example, FIG. 15.

At 1724, the second IC die is bonded and electrically coupled to the third IC die through the cap layer and the TIVs. See, for example, FIG. 16.

In some embodiments, the first IC die is configured to measure radiation incident thereon, the second IC die is configured to perform ISP on the measurements, and the third IC die is configured to store the measurements. In such embodiments, the first and second IC dies may be, for example, CIS dies and/or the third IC die may be, for example, a DRAM die. Further, in such embodiments, the first and second IC dies may define, for example, a CIS module. In other embodiments, the first IC die is configured to measure radiation incident thereon, the second IC die is configured to store the measurements, and the third IC die is configured to perform ISP on the measurements. In such embodiments, the first and third IC dies may be, for example, CIS dies and/or the second IC die may be, for example, a DRAM die.

While the method described by the flowchart 1700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases. For example, the first IC die may be omitted and the pixel sensor array may be arranged within the second IC die, such that 1702 may be omitted. As another example, 1716 may be replaced to form other conductive structures, such as microbumps, in place of the BGA.

In view of the foregoing, in some embodiments, the present disclosure provides an image sensor package. The image sensor package comprises a first IC die, a second IC die, and a fan-out structure. The first IC die comprises a pixel sensor array, and the second IC die is under and bonded to the first IC die. Further, the fan-out structure is under and bonded to the second IC die. The fan-out structure comprises a third IC die, a fan-out dielectric layer laterally adjacent to the third IC die, a TIV extending through the fan-out dielectric layer, and one or more RDLs under the third IC die and the TIV. The one or more RDLs electrically couple to the third IC die and the TIV.

In other embodiments, the present disclosure provides a method for manufacturing an image sensor package. A first IC die is bonded to a top of a second IC die and comprises a pixel sensor array. A fan-out structure is formed. Forming the fan-out structure comprises: forming an IDD layer; forming TIVs over the IDD layer; bonding a third IC die over the IDD layer, laterally adjacent to the TIVs; and forming one or more RDLs over and electrically coupled to the third IC die and the TIVs. The fan-out structure is bonded to a bottom of the second IC die through the IDD layer.

In yet other embodiments, the present disclosure provides another image sensor package. The other image sensor package comprises a first IC die, a second IC die, and a fan-out structure. The first IC die comprises a first semiconductor substrate, a first interconnect structure under the first semiconductor substrate, and a pixel sensor array between the first semiconductor substrate and the first interconnect structure. The second IC die is under and bonded to the first IC die. Further, the second IC die comprises a second interconnect structure, a second semiconductor substrate under the second interconnect structure, and a TSV extending through the second semiconductor substrate. The fan-out structure is under and bonded to the second IC die. The fan-out structure comprises a third IC die, a dielectric layer laterally adjacent to the third IC die, a TIV extending through the dielectric layer and aligned to the TSV, and one or more RDLs under the third IC die and the TIV. The one or more RDLs electrically couple to the third IC die and the TIV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor package comprising:
    a first integrated circuit (IC) die comprising a pixel sensor array;
    a second IC die under and bonded to the first IC die;
    an interface layer between the first IC die and the second IC die, wherein the interface layer is configured to bond and electrically couple the second IC die to the first IC die at an insulator-to-insulator interface and a metal-to-metal interface, and wherein the metal-to-metal interface is even with the insulator-to-insulator interface; and
    a fan-out structure under and bonded to the second IC die, wherein the fan-out structure comprises:
        a third IC die;
        a fan-out dielectric layer laterally adjacent to the third IC die;
        a through insulator via (TIV) extending through the fan-out dielectric layer; and
        one or more redistribution layers (RDLs) under the third IC die and the TIV, wherein the one or more RDLs electrically couple to the third IC die and the TIV.

2. An image sensor package comprising:
    a first integrated circuit (IC) die comprising a pixel sensor array;
    a second IC die under and bonded to the first IC die; and
    a fan-out structure under and bonded to the second IC die, wherein the fan-out structure comprises:
        a third IC die;
        a fan-out dielectric layer laterally adjacent to the third IC die;
        a through insulator via (TIV) extending through the fan-out dielectric layer; and
        one or more redistribution layers (RDLs) under the third IC die and the TIV, wherein the one or more RDLs electrically couple to the third IC die and the TIV;
    wherein the second IC die comprises:
        a semiconductor substrate along a bottom of the second IC die; and
        a through substrate via (TSV) extending through the semiconductor substrate, from the bottom of the second IC die, wherein the TSV is aligned and electrically coupled to the TIV.

3. The image sensor package according to claim 2, wherein the TSV extends from the bottom of the second IC die to a top of the second IC die.

4. The image sensor package according to claim 2, wherein the second IC die comprises an interconnect structure over the semiconductor substrate, and wherein the TSV terminates at a bottom of the interconnect structure.

5. The image sensor package according to claim 1, further comprising:
    a second interface layer between the second IC die and the fan-out structure, wherein the second interface layer is configured to bond and electrically couple the second IC die to the fan-out structure at a second insulator-to-insulator interface and a second metal-to-metal interface, and wherein the second metal-to-metal interface is even with the second insulator-to-insulator interface.

6. The image sensor package according to claim 1, wherein sidewalls of the fan-out structure are aligned to sidewalls of the second IC die and to sidewalls of the first IC die.

7. The image sensor package according to claim 1, wherein the second IC die is configured as an image signal processor (ISP) and the third IC die is configured as dynamic random-access memory (DRAM).

8. The image sensor package according to claim 1, wherein the second IC die is configured as dynamic random-access memory (DRAM) and the third IC die is configured as an image signal processor (ISP).

9. The image sensor package according to claim 1, wherein the fan-out structure comprises a fourth IC die arranged laterally adjacent to the third IC die.

10. An image sensor package comprising:
    a first integrated circuit (IC) die comprising a pixel sensor array and a first interconnect layer, wherein the first interconnect layer is electrically coupled to and underlies the pixel sensor array;
    a second IC die under the first IC die, wherein the second IC die is bonded and electrically coupled to the first IC die, and wherein the second IC die comprises:
        a semiconductor substrate along a bottom of the second IC die; and
        a pair of through substrate vias (TSVs) extending through the semiconductor substrate from the bottom of the second IC die; and a fan-out structure under and bonded to the second IC die, wherein the fan-out structure comprises:
  a fan-out dielectric layer;
  a third IC die over the fan-out dielectric layer, wherein the third IC die is recessed into the fan-out dielectric layer such that a top surface of the third IC die is even with a top surface of the fan-out dielectric layer;
  a pair of through insulator vias (TIV) extending through the fan-out dielectric layer, wherein the TIVs are on opposite sides of the third IC die, and wherein the TIVs are aligned and electrically coupled to the TSVs, respectively; and
  one or more redistribution layers (RDLs) under the third IC die and the TIVs, wherein the one or more RDLs electrically couple to the third IC die and the TIVs.

11. The image sensor package according to claim 10, wherein at least one of the TSVs extends from the bottom of the second IC die to a top of the second IC die.

12. The image sensor package according to claim 10, wherein the second IC die comprises an interconnect structure over the semiconductor substrate, and wherein the TSVs terminate at a bottom of the interconnect structure.

13. The image sensor package according to claim 10, wherein the second IC die comprises an interconnect structure over the semiconductor substrate, and wherein the interconnect structure comprises an interlayer dielectric (ILD) layer and a plurality of second interconnect layers stacked in the ILD layer.

14. The image sensor package according to claim 13, wherein the TSVs extend completely through the semiconductor substrate and the interconnect structure, wherein the second IC die comprises a pair of second TSVs between which the TSVs are laterally spaced, and wherein the second TSVs extend through the semiconductor substrate, from the bottom of the second IC die, to contact with a second interconnect layer of the interconnect structure.

15. The image sensor package according to claim 14, wherein the fan-out structure further comprises a pair of second TIVs extending through the fan-out dielectric layer, such that the TIVs and the third IC die are laterally spaced between the second TIVs, and wherein the second TIVs are aligned with and electrically coupled to the second TSVs, respectively.

16. The image sensor package according to claim 10, wherein opposite sidewalls of the fan-out structure are respectively aligned to opposite sidewalls of the second IC die, and are respectively aligned to opposite sidewalls of the first IC die.

17. The image sensor package according to claim 10, wherein third IC die comprises a bond pad on an underside of the third IC die, wherein a bottom surface of the bond pad is even with a bottom surface of the fan-out dielectric layer, and wherein the one or more RDLs comprise a conductive line extending continuously from contact with the bottom surface of the bond pad to contact with a bottom surface of one of the TIVs.

18. The image sensor package according to claim 10, wherein the fan-out structure comprises a fourth IC die arranged laterally adjacent to the third IC die, such that the third and fourth IC dies are laterally spaced between the TIVs.

19. The image sensor package according to claim 1, wherein the second IC die comprises a semiconductor substrate and an interconnect structure, wherein the semiconductor substrate and the interconnect structure are vertically stacked, and wherein the interconnect structure comprises an alternating stack of conductive lines and conductive vias.

20. The image sensor package according to claim 2, wherein the first IC die further comprises an additional semiconductor substrate and a first interconnect structure under the additional semiconductor substrate, wherein the pixel sensor array is between the additional semiconductor substrate and the first interconnect structure, and wherein the second IC die further comprises a second interconnect structure over the semiconductor substrate.

* * * * *